(12) United States Patent
Shum et al.

(10) Patent No.: US 10,312,442 B2
(45) Date of Patent: Jun. 4, 2019

(54) NON-VOLATILE MEMORY DEVICES, RRAM DEVICES AND METHODS FOR FABRICATING RRAM DEVICES WITH MAGNESIUM OXIDE INSULATOR LAYERS

(71) Applicant: Globalfoundries Singapore Pte. Ltd., Singapore (SG)

(72) Inventors: Danny Pak-Chum Shum, Singapore (SG); Desmond Jia Jun Loy, Singapore (SG); Wen Siang Lew, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/711,370

(22) Filed: Sep. 21, 2017

(65) Prior Publication Data

US 2019/0088874 A1  Mar. 21, 2019

(51) Int. Cl.
*H01L 47/00* (2006.01)
*H01L 45/00* (2006.01)
*H01L 27/24* (2006.01)

(52) U.S. Cl.
CPC ........ *H01L 45/146* (2013.01); *H01L 27/2436* (2013.01); *H01L 45/085* (2013.01); *H01L 45/1233* (2013.01); *H01L 45/1266* (2013.01); *H01L 45/1625* (2013.01)

(58) Field of Classification Search
CPC . H01L 45/146; H01L 27/2436; H01L 45/085; H01L 45/1233; H01L 45/1266; H01L 45/1625
See application file for complete search history.

(56) References Cited

U.S. PATENT DOCUMENTS

| 9,680,089 B1* | 6/2017 | Chen ........................ H01L 43/10 |
| 2013/0234094 A1* | 9/2013 | Chang ..................... H01L 45/04 257/4 |
| 2016/0248039 A1* | 8/2016 | Choung .............. H01L 51/5228 |
| 2017/0358742 A1* | 12/2017 | Govoreanu ........... H01L 27/249 |

* cited by examiner

*Primary Examiner* — Victor A Mandala
*Assistant Examiner* — Colleen E Snow
(74) *Attorney, Agent, or Firm* — Lorenz & Kopf, LLP

(57) ABSTRACT

Non-volatile memory (NVM) devices, resistive random access memory (RRAM) devices and methods for fabricating such devices are provided. In an exemplary embodiment, a non-volatile memory (NVM) device includes a first electrode and a second electrode positioned above the first electrode. Further, the NVM device includes a variable resistance material layer positioned between the first electrode and the second electrode. The variable resistance material layer contains magnesium oxide.

18 Claims, 3 Drawing Sheets

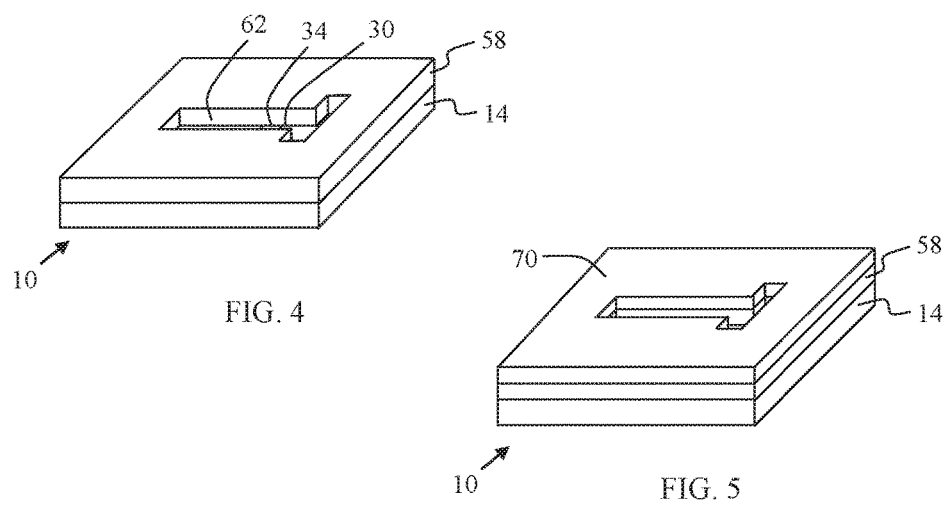
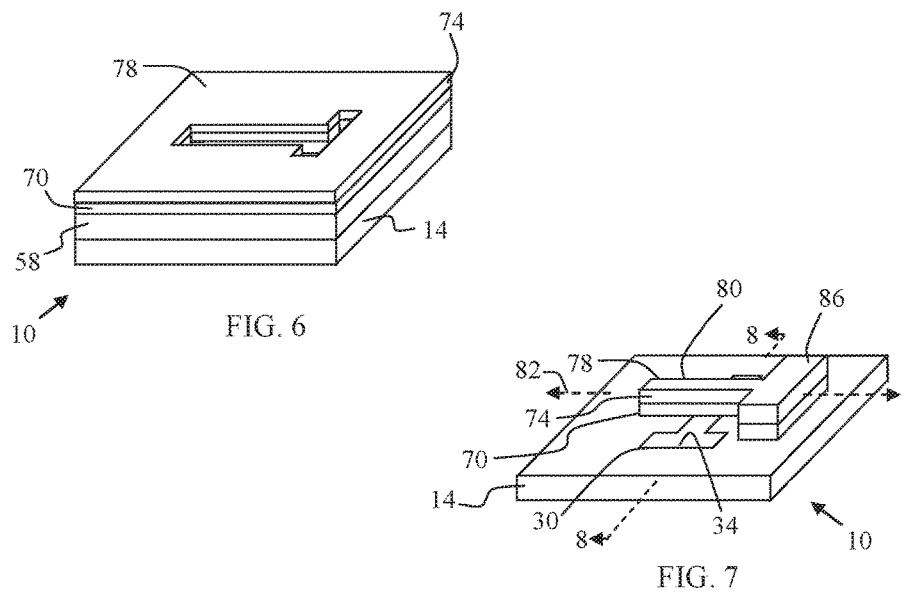

NON-VOLATILE MEMORY DEVICES, RRAM DEVICES AND METHODS FOR FABRICATING RRAM DEVICES WITH MAGNESIUM OXIDE INSULATOR LAYERS

TECHNICAL FIELD

The technical field generally relates to sophisticated semiconductor devices and the manufacturing of such devices, and, more specifically, to a non-volatile memory (NVM) device, such as a resistance random access memory (RRAM) device, with a magnesium oxide insulator layer, and methods for fabricating such devices.

BACKGROUND

As is well known to those skilled in the art, non-volatile memory devices are characterized in that there is no loss of data stored in their memory cells, even when an external power supply is removed. For that reason, such non-volatile memory devices are widely employed in computers, mobile communication systems, memory cards and the like.

Flash memory structures are widely used in such non-volatile memory applications. The typical flash memory device employs memory cells having a stacked gate structure. The stacked gate structure typically includes a tunnel oxide layer, a floating gate, an inter-gate dielectric layer and a control gate electrode, which are sequentially stacked above a channel region. While flash memory structures have enjoyed enormous success, the continued and ever-present drive to reduce the size of integrated circuit products has created many challenges for the continued scaling of flash memory devices. Such challenges include scaling of program/erase voltages, access speed, reliability, the number of charges stored per floating gate, etc.

The limitations of flash memories such as decreased endurance and reliability have sped up the search for alternative non-volatile memories. These limitations become more significant when memory devices scale down in sizes to keep up with the rising demands of the digital world. In recent years, alternative non-volatile memory devices such as resistive random access memory (RRAM) devices have emerged as one of the potential candidates to replace flash memories, owing to simple metal-insulator-metal (MIM) structure, complementary metal oxide semiconductor (CMOS) compatibility, fast access speeds and low power consumptions.

A resistance random access memory (RRAM) device is a simple two-terminal device memory device including two spaced-apart electrodes with a variable resistance material layer or ion conductor layer positioned between the two electrodes. The variable resistance material layer typically includes various metal oxides, such as hafnium oxide, tantalum oxide, nickel oxide, titanium oxide, zirconium oxide, copper oxide, or aluminum oxide. The variable resistance material layer is used as a data storage layer. The resistance of the variable resistance material layer may be varied or changed based upon the polarity and/or amplitude of an applied electric pulse. The electric voltage or electric current density from the pulse, or pulses, is sufficient to switch the physical state of the materials so as to modify the conducting properties of the material and establish a highly localized conductive filament (CF) in the variable resistance material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial change.

In general, after an RRAM device is initially fabricated, the variable resistance material layer does not exhibit any switching properties. Rather, a so-called FORMING process, a high-voltage, high-current process, is performed to initially form the localized conductive filament with oxygen vacancies from the cathode, establishing a low-resistance state (LRS) exhibiting a relatively high current flow. A so-called RESET process is performed to break the conductive filament and establish a high-resistance state (HRS) exhibiting a relatively low current flow. This RESET process is typically a current-driven thermal process that causes the conductive filament to be broken by a heat-assisted chemical reaction.

The most common switching mechanisms in RRAMs are of valence change memory (VCM) type and electrochemical metallization (ECM) memory type. The switching mechanism of an RRAM is determined by the type of filament formed between the active and inert electrodes of the RRAM. While filaments in VCM are formed by anionic oxygen vacancies, filaments in ECM are formed by cationic species generated from the active electrode; hence redox chemical reactions are of importance in understanding the formation of filaments. The binary memory states of RRAM devices arise from its high resistance state (HRS) and low resistance state (LRS). HRS and LRS occur when the filaments are ruptured and formed between the active and inert electrodes of the RRAM. The applied voltage difference between the active and inert electrodes results in either the formation or rupture of filaments. A SET state occurs when HRS becomes LRS and a RESET state occurs when LRS become HRS. In the SET state, a compliance current limit is imposed to protect the resistive switching devices from high current damages.

Note that the RESET process removes only a portion of the entire length of the conductive filament, i.e., the RESET process does not remove the entire conductive filament. After a RESET process is performed, a so-called SET process is performed to reestablish the conductive filament and thus the low-resistance state of the RRAM device. The SET process is essentially the same as the FORMING process except that the SET process is performed at a lower voltage than the FORMING process since the filament length to be reestablished is shorter than the length of the conductive filament that was formed during the FORMING process. The FORMING process requires a larger voltage than the SET process because the oxide lattice needs to be broken to form a pathway for the filament to grow onto. After the pathway is established, a lower voltage (or energy) is sufficient for the filament to grow on.

One problem associated with typical RRAM device fabrication is that the variable resistance material layer, i.e., hafnium oxide, tantalum oxide, nickel oxide, titanium oxide, zirconium oxide, copper oxide, or aluminum oxide layer, typically must be deposited by atomic layer deposition (ALD), which can be an expensive process. Further, typical RRAM device fabrication is a time consuming process. Also, the filaments established in the variable resistance material can be difficult to study and observe. As a result, there is presently insufficient understanding of the physics of current RRAM operation.

Accordingly, it is desirable to provide an improved NVM device, such as a RRAM device, and improved method for fabricating such devices. It is further desirable to provide RRAM devices with magnesium oxide insulator layers that may be deposited by physical vapor deposition (PVD) or sputtering. It is also desirable to provide methods for fabricating NVM devices that are less expensive and less time consuming than current methods. Furthermore, other desirable features and characteristics will become apparent from the subsequent detailed description and the appended claims, taken in conjunction with the accompanying drawings and this background.

BRIEF SUMMARY

Non-volatile memory (NVM) devices, resistive random access memory (RRAM) devices and methods for fabricating such devices are provided. In an exemplary embodiment, a non-volatile memory (NVM) device includes a first electrode and a second electrode positioned above the first electrode. Further, the NVM device includes a variable resistance material layer positioned between the first electrode and the second electrode. The variable resistance material layer contains magnesium oxide.

In another embodiment, a resistive random access memory (RRAM) device includes a substrate and a magnesium oxide (MgO) based metal-insulator-metal (MIM) structure overlying the substrate.

In yet another exemplary embodiment, a method for fabricating a resistive random access memory (RRAM) device is provided. The method includes forming a first electrode over a substrate. Further, the method includes forming a magnesium oxide (MgO)-containing insulator layer over the first electrode. Also, the method includes forming a second electrode over the MgO-containing insulator layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIGS. 1-7 are schematic perspective views of integrated circuit fabrication processing for forming an NVM device such as an RRAM device in accordance with an embodiment herein;

DETAILED DESCRIPTION

Figure 1:
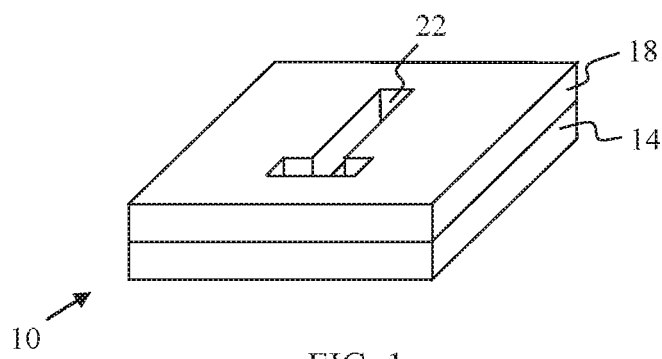

The following detailed description is merely exemplary in nature and is not intended to limit the NVM devices, RRAM devices, or methods for fabricating devices described herein. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication memory devices are well-known and so, in the interest of brevity, many conventional processes will only be mentioned briefly herein or will be omitted entirely without providing the well-known process details. Further, it is noted that NVM devices, such as RRAM devices, include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "under", "lower", "higher" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Embodiments herein are directed towards a non-volatile memory device and various methods of fabricating such a device. As described herein, a NVM device, such as an RRAM device, includes a magnesium oxide variable resistance material layer or insulator layer. Such magnesium oxide layer may be deposited by physical vapor deposition (PVD) or sputtering. As used herein, a "material layer" is a layer that includes at least 50 wt. % of the identified material. For example, a magnesium oxide layer is a layer that is at least 50 wt. % magnesium oxide. Likewise, a layer that is a "material" includes at least 50 wt. % of the identified material. As will be readily apparent to those skilled in the art upon a complete reading of the disclosure, the devices disclosed herein may be employed with a variety of technologies, e.g., NMOS, PMOS, CMOS, etc., and may be incorporated into a variety of integrated circuit products. With reference to the attached drawings, various illustrative embodiments of the methods and devices disclosed herein will now be described in more detail. It should be understood that the various features and layers in the attached drawings may not be to scale.

Magnesium oxide is believed to exhibit resistance to thermal stress and has compatibility with CMOS. Further, magnesium oxide has intrinsic properties such as large bandgap, high dielectric constant, and high thermal conductivity that are favorable for use as the insulator layer in an RRAM.

FIGS. 1-7 depict an embodiment of a method for fabricating an integrated circuit device 10, such as a non-volatile memory device. Specifically, the illustrated method may be used to fabricate a resistance random access memory (RRAM) device. In FIG. 1, a partially fabricated integrated circuit device 10 is illustrated and is formed on or includes a substrate 14. An exemplary substrate 14 is a dielectric layer. As used herein, a "dielectric" layer is a non-metallic solid material displaying insulating properties, having a filled valence band at 0K, and a band gap on the order of approximately 5 eV. An exemplary substrate 14 may be formed from silicon dioxide (SiO$_2$), hafnium oxide, silicon nitride, tetraethylorthosilicate (TEOS) based oxides, boro-phospho-silicate-glass (BPSG), phospho-silicate-glass (PSG), boro-silicate-glass (BSG), oxide-nitride-oxide (ONO), oxynitride materials, plasma enhanced silicon nitride (p-SiN$_x$), a spin on glass (SOG), titanium oxide, or like dielectric materials.

In FIG. 1, a mask 18 is formed and patterned over the substrate 14. In an exemplary embodiment, the mask 18 is photoresist. Such a mask 18 may be formed and patterned by depositing photoresist material over the substrate 14, baking the photoresist material, exposing the photoresist material to a desired pattern of radiation, developing the exposed photoresist material with a resist developer to provide the patterned photoresist mask 18 with opening 22. The opening 22 exposes a portion of the substrate 14.

After forming the patterned mask 18, an etch process may be performed on the exposed portion of the substrate 14. For example, an ion beam milling process may be performed to etch the portion of the substrate 14 not covered by the mask 18 to form a recess 24 terminating at a recessed surface 26 at a desired depth (shown in FIG. 8). For example, the exposed portion of the substrate 14 may be etched to form the recess 24 with a depth (in the direction of arrow 27) of from about 5 to about 20 nanometers (nm).

Figure 2:
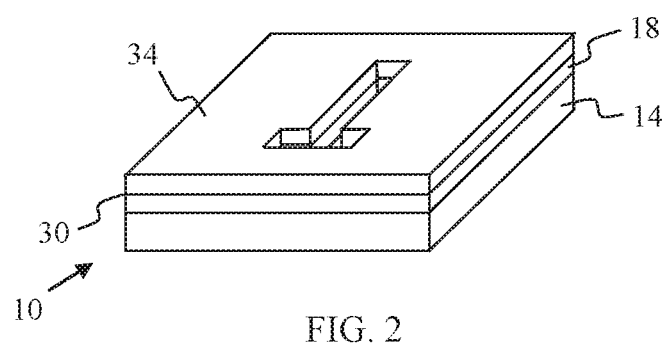

In FIG. 2, the method may continue with the deposition of layers over the substrate 14. For example, a seed layer 30 may be formed in the recess 24 over the recessed surface 26 of the substrate 14 and over the mask 18. An exemplary seed layer 30 is tantalum, platinum, gold, copper, or another suitable seed material. An exemplary seed layer 30 may be formed with a thickness of from about 2 to about 10 nm, such as about 5 nm. In an exemplary method, the seed layer 30 is formed by a thin film deposition technique such as sputtering or ion beam deposition.

After the seed layer 30 is formed, a bottom electrode layer 34 is formed over the seed layer 30. For example, a bottom electrode layer 34 is formed in the recess 24 and over the seed layer 30 and over the mask 18. An exemplary bottom electrode layer 34 may be ruthenium (Ru), platinum (Pt), indium (In), molybdenum (Mo), tungsten (W), or another suitable conductive material. An exemplary bottom electrode layer 34 is formed with a thickness of from about 5 nm to about 20 nm, such as about 10 nm. In an exemplary method, the bottom electrode layer 34 is formed by a thin film deposition technique such as sputtering or ion beam deposition.

Figure 3:
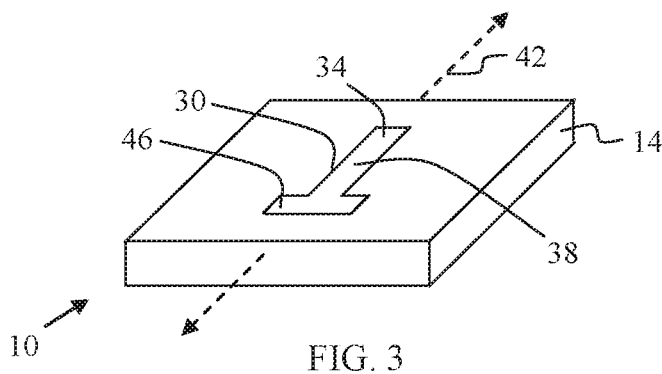

In FIG. 3, the mask 18 and the portions of the seed layer 30 and bottom electrode layer 34 overlying the mask 18 are removed from the substrate 14. In an embodiment, the mask 18 and overlying layers may be removed by a lift off process. For example, the mask 18 and overlying layers may be removed by using a standard photoresist lift off process in acetone or other standard solvents. As a result, the partially fabricated device 10 is provided with the structure of FIG. 3 in which the seed layer 30 and bottom electrode 34 are on the recessed surface 26 and embedded in the recess 24 of the substrate 14.

Figure 8:
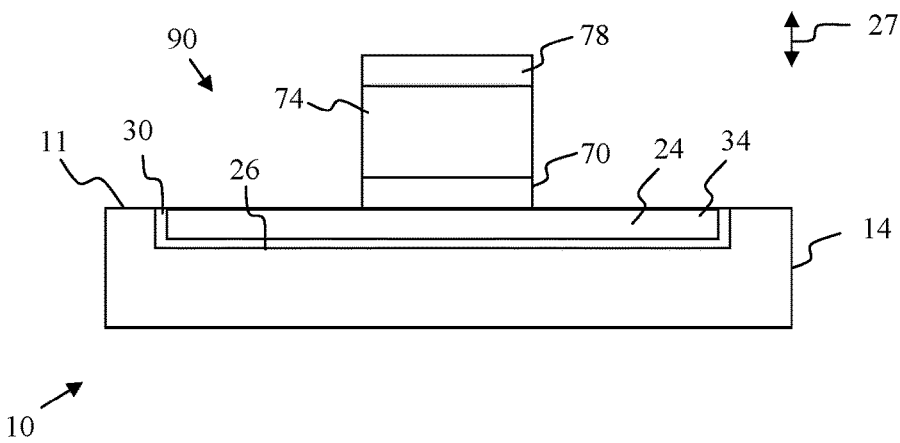
FIG. 8 is a cross section view of the structure of the device of FIG. 7, in accordance with embodiments herein.

Cross-referencing FIGS. 1-3 with FIG. 8, the mask opening 22, recess 24, and embedded seed layer 30 and bottom electrode layer 34 are formed with a T-shape having a main portion 38 extending in the direction of a major axis 42 (shown in FIG. 3) and a cross portion 46 extending perpendicular to the major axis 42. While the components are illustrated as having a T-shape, other shapes are contemplated and may be suitable for different layout designs.

In FIG. 4, a mask 58 is formed and patterned over the structure of the partially fabricated integrated circuit device 10 of FIG. 3. In an exemplary embodiment, the mask 58 is photoresist. Such a mask 58 may be formed and patterned by depositing photoresist material over the substrate 14 and embedded seed layer 30 and embedded bottom electrode 34, baking the photoresist material, exposing the photoresist material to a desired pattern of radiation, developing the exposed photoresist material with a resist developer to provide the patterned photoresist mask 58 with opening 62. The opening 62 exposes a portion of the underlying substrate 14 and embedded seed layer 30 and embedded bottom electrode 34.

After forming the patterned mask 58, the method may continue in FIG. 5 with the deposition of layers over the substrate 14 and embedded seed layer 30 and embedded bottom electrode 34. For example, an insulator layer 70 may be formed over the substrate 14, embedded seed layer 30 and embedded bottom electrode 34 and over the mask 58. An exemplary insulator layer 70 is a dielectric layer. An exemplary insulator layer 70 is a magnesium oxide (MgO)-containing insulator layer. An exemplary insulator layer 70 is magnesium oxide (MgO). An exemplary insulator layer 70 may be formed with a thickness of from about 5 to about 50 nm, for example from about 5 to about 20 nm, such as about 10 nm. In an exemplary method, the insulator layer 70 is formed by a thin film deposition technique such as sputtering or ion beam deposition or physical vapor deposition (PVD).

An exemplary insulator layer 70 is formed from a variable resistance material that may include a metal oxide-metal nano-crystal material, for example, a magnesium oxide layer of material that contains magnesium nano-crystals. In certain embodiments, the insulator layer 70 may be at least about 50 wt. %, such as at least about 60 wt. %, at least about 70 wt. %, at least about 80 wt. %, at least about 90 wt. %, or at least about 95 wt. % magnesium oxide. In certain embodiments, the insulator layer 70 may be used as oxygen getter. In such embodiments, the MgO-containing insulator layer 70 may be a composite layer of including magnesium oxide and a second oxide. For example, the MgO-containing insulator layer 70 may be a magnesium oxide/hafnium oxide (MgO/HfO$_x$) insulator layer, a magnesium oxide/aluminum oxide (MgO/AlO$_x$) insulator layer, a magnesium oxide/tantalum oxide (MgO/TaO$_x$) insulator layer, or a composite of magnesium oxide and any other suitable oxide that provides a significant different in bandgap as compared to magnesium oxide. Such an MgO-containing insulator layer may be at least about 50 wt. %, such as at least about 60 wt. %, at least about 70 wt. %, at least about 80 wt. %, at least about 90 wt. %, or at least about 95 wt. % magnesium oxide/second oxide; and may have a magnesium oxide composition of less than about 50 wt. %, such as at least about 20 wt. %, at least about 30 wt. %, or at least about 40 wt. %, or greater than about 50 wt. %.

In FIG. 6, after the insulator layer 70 is formed, a top electrode layer 74 is formed over the insulator layer 70, including in the opening 62. An exemplary top electrode layer 74 may be tantalum (Ta), hafnium (Hf), titanium (Ti), titanium nitride (TiN), cobalt (Co), gold (Au), indium tin oxide (ITO), copper (Cu), or silver (Ag). An exemplary top electrode layer 74 is formed with a thickness of from about 10 to about 60 nm, for example from about 20 to about 40 nm, such as about 30 nm. In an exemplary method, the top electrode layer 74 is formed by a thin film deposition technique such as sputtering or ion beam deposition.

After the top electrode layer 74 is formed, a capping layer 78 may be formed over the top electrode layer, including in the opening 62. An exemplary capping layer 78 is gold (Au), platinum (Pt), or any other suitable inert material. An exemplary capping layer 78 is formed with a thickness of from about 5 nm to about 20 nm, for example from about 8 nm to about 16 nm, such as about 12 nm. In an exemplary method, the capping layer 78 is formed by a thin film deposition technique such as sputtering or ion beam deposition.

In FIG. 7, the mask 58 and the portions of the insulator layer 70, top electrode layer 74, and capping layer 78 overlying the mask 58 are removed from the underlying substrate 14, embedded seed layer 30 and embedded bottom electrode 34. In an embodiment, the mask 58 and overlying layers may be removed by a lift off process. For example, the mask 58 and overlying layers may be removed by using a standard photoresist lift off process in acetone or other standard solvents. As a result, the partially fabricated device 10 is provided with the structure of FIG. 7 in which the insulator layer 70, top electrode layer 74, and capping layer 78 are formed with a T-shape lying over the substrate 14 and across the embedded seed layer 30 and embedded bottom electrode 34. Specifically, the opening 62 (of FIGS. 4-6) and remaining portions of the insulator layer 70, top electrode layer 74, and capping layer 78 in FIG. 7 are formed with a T-shape having a main portion 80 extending in the direction of a major axis 82 (shown in FIG. 7) and a cross portion 86 extending perpendicular to the major axis 82. Cross-referencing FIGS. 3 and 7, it may be seen that axis 42 is substantially perpendicular to axis 82. While the components are illustrated as having a T-shape, other shapes are contemplated and may be suitable for different layout designs.

FIG. 7 depicts the integrated circuit device 10 as a RRAM device fabricated according to the processes described in relation to FIGS. 1-6. FIG. 8 provides a cross-section view of the device 10 of FIG. 7 taken along line 8-8.

As shown, the integrated circuit device 10 of FIG. 8 includes a bottom electrode 34 overlying a seed layer 30 formed on recessed surface 26. The bottom electrode 34 and seed layer 30 are embedded in the recess 24 formed in the substrate 14 such that the bottom electrode 34, seed layer 30, and substrate 14 share a common upper surface 11. Insulator layer 70 lies on the upper surface 11 of the bottom electrode layer 34. Top electrode layer 74 lies on the insulator layer 70, and capping layer 78 lies on the top electrode layer 74.

The bottom electrode layer 34, insulator layer 70 and top electrode layer 74 form a magnesium oxide (MgO) based metal-insulator-metal (MIM) capacitor structure 90 that exhibits a resistance switching effect. The resistance of the RRAM device 10 can be altered by simply applying an external bias across the MIM structure 90. Typically, the electrode on which a voltage or current is applied is referred to as the top electrode, and the other electrically grounded electrode is called as the bottom electrode.

For a RRAM device 10 using electrochemical metallization memory (ECM) as a switching mechanism, the top electrode layer 74 is typically selected from copper (Cu) and silver (Ag). In ECM devices, atoms from the active electrode are oxidized—stripped of an electron—by the "write" voltage. The resulting ions migrate through the insulator layer toward the other electrode. When the atoms reach the other electrode, they get an electron back. Other ions arrive and pile on, eventually forming a pure metallic filament linking both electrodes, thus lowering of the resistance of the device.

In an exemplary embodiment herein, a MIM structure 90 is formed with a ruthenium bottom electrode layer 34, a magnesium oxide insulator 70, and a copper top electrode 74, i.e., a Ru/MgO/Cu MIM structure is provided. To form such a MIM structure, a DC magnetron sputtering process was first performed on a ruthenium target where a thin layer of ruthenium bottom electrode was deposited in argon ambient at room temperature, with an argon gas pressure of 2 mTorr at 20 sccm. An RF magnetron sputtering process was performed on a magnesium oxide target where a thin magnesium oxide dielectric layer was deposited in argon ambient at room temperature, with an argon gas pressure of 1.5 mTorr at 20 sccm. Thereafter, a DC magnetron sputtering process was performed on a copper target in argon ambient at room temperature, with an argon gas pressure of 6.5 mTorr at 20 sccm. Annealing was performed in vacuum conditions at elevated temperature for a short period of time, such as for about one hour. The fabricated device was characterized using conventional semiconductor parameter analyzer.

For a RRAM device 10 using valence change mechanism (VCM) as a switching mechanism, the top electrode layer 74 is typically selected from tantalum (Ta), hafnium (Hf), titanium (Ti), titanium nitride (TiN), cobalt (Co), gold (Au), and indium tin oxide (ITO). In VCM devices, both negatively charged oxygen ions and positively charged metal ions result from the "write" voltage. Theoretically, the oxygen ions are taken out of the insulator layer, contributing to a filament consisting of semiconducting material that builds up between the electrodes.

In an exemplary embodiment herein, a MIM structure 90 is formed with a ruthenium bottom electrode layer 34, a magnesium oxide insulator 70, and a tantalum top electrode 74, i.e., a Ru/MgO/Ta MIM structure is provided. To form such a MIM structure, a DC magnetron sputtering process was first performed on a ruthenium target where a thin layer of ruthenium bottom electrode was deposited in argon ambient at room temperature, with an argon gas pressure of 2 mTorr at 20 sccm. An RF magnetron sputtering process was performed on a magnesium oxide target where a thin magnesium oxide dielectric layer was deposited in argon ambient at room temperature, with an argon gas pressure of 1.5 mTorr at 20 sccm. Thereafter, a DC magnetron sputtering process was performed on a tantalum target in argon ambient at room temperature, with an argon gas pressure of 6.5 mTorr at 20 sccm. Annealing was performed in vacuum conditions at elevated temperature for a short period of time, such as for about one hour. The fabricated device was characterized using conventional semiconductor parameter analyzer.

The behavior of electrons and ions between interfaces of the RRAMs is known as conduction mechanisms. Herein, conduction mechanisms in the Ru/MgO resistive switching device interface were investigated for Cu and Ta active electrodes, accounting for both ECM and VCM switching mechanisms respectively. It is theorized that a conduction mechanism based on Schottky emission is provided by the structure of the RRAM device 10. The Schottky emission conduction mechanism occurs when thermally activated electrons gain sufficient energy to jump into the conduction band of the dielectric. Schottky emission is the most observed conduction mechanism and is an electrode-limited conduction mechanism. Equation (1) exhibits the current density expression for Schottky emission. In equation (1), q is the electron charge, m* is the electron effective mass in the oxide, k is Boltzmann's constant, T is the absolute temperature, h is Planck's constant, $\Phi_B$ is the junction barrier height, E is the electric field across the oxide, and a is the permittivity of the magnesium oxide layer.

$$J_{SE} = \frac{4\pi q m^*(kT)^2}{h^3} \exp\left[\frac{-q\left(\Phi_B - \sqrt{qE/4\pi\varepsilon}\right)}{kT}\right] \quad (1)$$

In the Schottky emission analysis of I-V curves, equation (1) is linearized and the thickness of the magnesium oxide layer, d, is calculated from the gradient, M of linearized equation (1). The expression of d is shown in equation (2) and is used to compare with the thickness of the magnesium oxide layer deposited during the PVD process. In equation (2), q is the electron charge, k the Boltzmann constant, T the absolute temperature, while M is the gradient of the linear Schottky emission graph fit.

$$d_{SE} = \frac{q^3}{(2kTM)^2\pi\varepsilon} \quad (2)$$

Similarly, the Schottky barrier height (SBH), $\Phi_B$ of the interface between the first electrode (e.g., Ru) and the magnesium oxide layer may be calculated from the vertical intercept of linearized equation (1). In equation (3), the parameters used are the same as (2), except that A is the cross-section area of the resistive switching device and C is the vertical intercept of the linear Schottky emission graph fit.

$$\Phi_B = \frac{kT}{q}\left[\ln\left(\frac{4\pi q m^*(kT)^2 A}{h^3}\right) - C\right] \quad (3)$$

As described herein, an exemplary non-volatile memory device, such as an RRAM device, is provided with an improved insulator layer of magnesium oxide. The magnesium oxide insulator layer facilitates a less time consuming and less costly method for fabricating the RRAM device. Further, the MgO based structure provides for ECM or VCM switching mechanisms and for a conduction mechanism based on Schottky emission. Further, the processes described herein are similar to processes in conventional CMOS processing such that necessary process equipment and actions are available.

Figure 9:
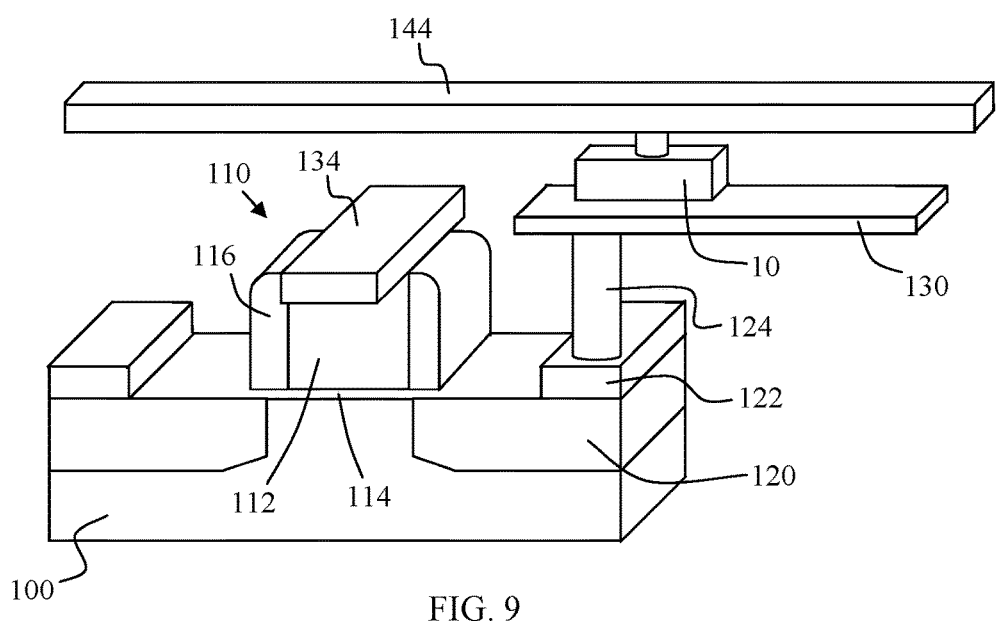
FIG. 9 is a schematic perspective view of an NVM device such as an RRAM device formed between metallization layers in an integrated circuit in accordance with an embodiment herein.

FIG. 9 provides a perspective view of a device 10, such as a RRAM device, formed between metallization layers during a typical integrated circuit process flow. As shown, a substrate 100 may be provided, and a typical sequence of shallow trench isolation (STI) formation, front end of line (FEOL) processing, silicidation, and contact processing may be performed. As a result, a transistor 110, such as an NMOS transistor, is formed over the substrate 100 and includes a gate 112 overlying a gate oxide 114 with a first metallization layer ("M1") 134, spacers 116 formed around the gate 112, and source/drain regions 120 formed in the substrate 100 adjacent the gate 112. In an exemplary embodiment, the source is connected to second metallization "M2" and the drain is connected to third metallization layer "M3". Contact regions 122 are formed over the source/drain regions 120 and contact pillars or vias 124 are formed through dielectric layers (not shown) and in contact with the contact regions 122.

Processing continues with the formation of standard CMOS back end of line (BEOL) processing wherein the RRAM device 10 can be inserted in between metallization layers $M_x$ and $M_{x+1}$, for example, between third metallization layer ("M3") 130 and fourth metallization layer ("M4") 144. As shown, third metallization layer 130 is formed in selective contact with the contact via 124 in connection to the drain. After formation of the third metallization layer 130, the RRAM device processing as described above may be performed to form the RRAM device 10 over the metallization layer 130.

After formation of the RRAM device 10, the processing may continue with the formation of next level metallization Mx+1, for example the fourth metallization layer M4 144 that forms a global bitline line (BL) over the RRAM device 10. After last Cu fatwire metallization completion, the far back end of line (FBEOL) processing includes aluminum metallization processing, passivation, and an opening to bond pad process that may be performed in sequence. As a result, metallization layer 144 is formed over and selectively coupled to the RRAM device 10 as a global bitline.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A non-volatile memory (NVM) device comprising:
    a substrate;
    a first electrode;
    a seed layer positioned between the substrate and the first electrode;
    a second electrode positioned above the first electrode; and
    a single variable resistance material layer positioned between the first electrode and the second electrode and having a first surface in direct contact with the first electrode and a second surface in direct contact with the second electrode, wherein the variable resistance material layer contains magnesium oxide.

2. The device of claim 1 wherein the first electrode is comprised of at least one of ruthenium (Ru), platinum (Pt), indium (In), molybdenum (Mo), and tungsten (W).

3. The device of claim 1 wherein the second electrode is comprised of at least one of tantalum (Ta), hafnium (Hf), titanium (Ti), titanium nitride (TiN), cobalt (Co), gold (Au), indium tin oxide (ITO), copper (Cu), and silver (Ag).

4. The device of claim 1 wherein the seed layer is comprised of tantalum, platinum, gold, or copper.

5. The device of claim 1 further comprising a capping layer over the second electrode.

6. The device of claim 5 wherein the capping layer is comprised of gold (Au).

7. The device of claim 5 wherein:
the seed layer has a thickness of from about 2 nm to about 10 nm;
the first electrode has a thickness of from about 5 nm to about 20 nm;
the variable resistance material layer has a thickness of from about 5 nm to about 20 nm;
the second electrode has a thickness of from about 20 nm to about 40 nm; and
the capping layer has a thickness of from about 5 nm to about 20 nm.

8. The device of claim 1 wherein:
the first electrode has a thickness of from about 5 nm to about 20 nm;
the variable resistance material layer has a thickness of from about 5 nm to about 20 nm; and
the second electrode has a thickness of from about 20 nm to about 40 nm.

9. The device of claim 1 wherein:
the first electrode is comprised of ruthenium (Ru);
the second electrode is comprised of tantalum (Ta); and
the device uses valence change mechanism (VCM) as a switching mechanism.

10. The device of claim 1 wherein:
the first electrode is comprised of ruthenium (Ru);
the second electrode is comprised of copper (Cu); and
the device uses electrochemical metallization memory (ECM) as a switching mechanism.

11. The device of claim 1 wherein the device uses a Schottky emission-based switching mechanism.

12. The device of claim 1 wherein the device uses electrochemical metallization memory (ECM) as a switching mechanism.

13. A resistive random access memory (RRAM) device comprising:
a substrate;
a magnesium oxide (MgO) based metal-insulator-metal (MIM) structure overlying the substrate and comprising a first electrode over the substrate, an insulator over the first electrode, and a second electrode over the insulator; and
a seed layer between the substrate and the first electrode.

14. The device of claim 13 wherein:
the first electrode is comprised of at least one of ruthenium (Ru), platinum (Pt), indium (In), molybdenum (Mo), and tungsten (W);
the second electrode is comprised of at least one of tantalum (Ta), hafnium (Hf), titanium (Ti), titanium nitride (TiN), cobalt (Co), gold (Au), indium tin oxide (ITO), copper (Cu), and silver (Ag); and
the insulator layer is a magnesium oxide (MgO) insulator layer.

15. The device of claim 14 further comprising a capping layer over the second electrode.

16. The device of claim 13 wherein the device uses valence change mechanism (VCM) as a switching mechanism.

17. A method for fabricating a resistive random access memory (RRAM) device comprising:
forming a first electrode over a substrate;
forming a magnesium oxide (MgO)-containing insulator layer over the first electrode; and
forming a second electrode over the MgO-containing insulator layer;
wherein forming the first electrode over the substrate comprises patterning a first mask over the substrate, depositing a first electrode material over the substrate, and removing the first mask and overlying layers from the substrate; and
wherein forming the magnesium oxide (MgO)-containing insulator layer over the first electrode and forming the second electrode over the MgO-containing insulator layer comprises patterning a second mask over the first electrode and the substrate, depositing MgO-containing material over the substrate and the first electrode, depositing a top electrode material over the MgO-containing material, and removing the second mask and overlying layers from the substrate.

18. The method of claim 17 wherein:
depositing the first electrode material over the substrate comprises sputtering the first electrode material over the substrate; and
depositing the MgO-containing material over the substrate and the first electrode comprises sputtering the MgO-containing material over the substrate and the first electrode; and
depositing the top electrode material over the MgO-containing material comprises sputtering the top electrode material over the MgO-containing material.

* * * * *